US007001814B1

(12) United States Patent
Halliyal et al.

(10) Patent No.: US 7,001,814 B1
(45) Date of Patent: Feb. 21, 2006

(54) LASER THERMAL ANNEALING METHODS FOR FLASH MEMORY DEVICES

(75) Inventors: Arvind Halliyal, Cupertino, CA (US); Mark T. Ramsbey, Sunnyvale, CA (US); Robert B. Ogle, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 92 days.

(21) Appl. No.: 10/438,942

(22) Filed: May 16, 2003

(51) Int. Cl.
*H01L 21/336* (2006.01)

(52) U.S. Cl. ...................................... 438/287; 438/257
(58) Field of Classification Search ................ 438/257, 438/287, 263, 217
See application file for complete search history.

(56) References Cited

U.S. PATENT DOCUMENTS

| 5,434,109 | A | * | 7/1995 | Geissler et al. ............. 438/702 |
| 6,066,574 | A | | 5/2000 | You et al. |
| 6,074,917 | A | | 6/2000 | Chang et al. |
| 6,127,216 | A | | 10/2000 | Yu |
| 6,180,538 | B1 | | 1/2001 | Halliyal et al. |
| 6,265,250 | B1 | | 7/2001 | Yu |
| 6,356,482 | B1 | | 3/2002 | Derhacobian et al. |
| 2004/0000688 | A1 | * | 1/2004 | Harari et al. ............... 257/315 |

* cited by examiner

*Primary Examiner*—Caridad M. Everhart (57) ABSTRACT

A method of manufacturing an ONO (oxide-nitride-oxide) insulating layer for a flash memory device, the insulating layer including a first oxide layer, a nitride layer over the first oxide layer, and a second oxide layer over the nitride layer, wherein at least one of the first oxide layer, the nitride layer and the second oxide layer are conditioned using laser thermal annealing.

27 Claims, 4 Drawing Sheets

LASER THERMAL ANNEALING METHODS FOR FLASH MEMORY DEVICES

FIELD OF THE INVENTION

The present invention relates to the manufacturing of semiconductor devices, and more particularly, to laser thermal anneal methods for manufacturing flash memory devices such as EEPROMS (electrical erasable programmable read only memory devices). Even more particularly, the present invention relates to laser thermal anneal methods for manufacturing high-k (high dielectric constant) charge trapping layers in flash memory devices.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed. The gate electrode, which acts as a conductor, is separated from the substrate by an insulating layer typically made from a gate oxide film, such as silicon oxide ($SiO_2$). Source and drain regions are typically formed in regions of the substrate adjacent the gate electrode by doping the regions with a dopant of a desired conductivity. The insulating layer is provided to prevent current from flowing between the gate electrode and the source, or drain regions.

In operation, a voltage is typically developed between the source and drain terminals. When an input voltage is applied to the gate electrode, a transverse electric field is set up in the channel region below the gate oxide and between the source and drain regions. By varying the transverse electric field, it is possible to modulate the conductance of the channel region between the source and drain regions. In this manner an electric field is used to control the current flow through the channel region.

Figure 1:
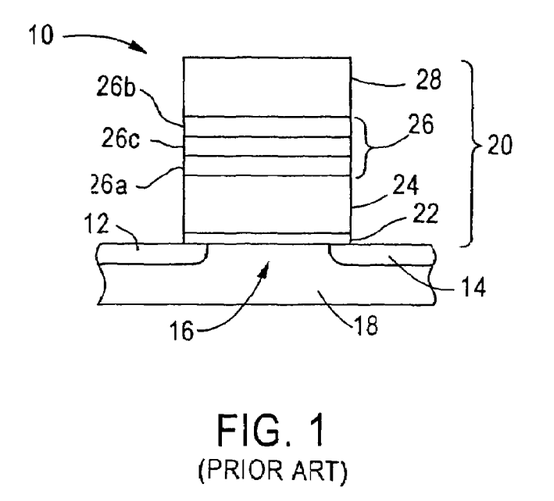
FIG. 1 is a cross-sectional view of relevant portions of a flash memory device.

One specific type of MOS semiconductor device is a nonvolatile memory device such as a flash EEPROM (electrical erasable programmable read only memory device). FIG. 1 represents the relevant portions of a typical flash memory device 10. The memory cell 10 typically includes a source region 12, a drain region 14 and a channel region 16 in a substrate 18; and a stacked gate structure 20 overlying the channel region 16. The stacked gate 20 includes a thin gate dielectric layer 22 (commonly referred to as the tunnel oxide) formed on the surface of the substrate 18. The stacked gate 20 also includes a polysilicon floating gate 24 which overlies the tunnel oxide 22 and an interpoly dielectric layer 26 which overlies the floating gate 24. The interpoly dielectric layer 26 is often a multilayer insulator such as an oxide-nitride-oxide (ONO) layer having two oxide layers 26a and 26b sandwiching a nitride layer 26c. Lastly, a polysilicon control gate 28 overlies the interpoly dielectric layer 26. The channel region 16 of the memory cell 10 conducts current between the source region 12 and the drain region 14 in accordance with an electric field developed in the channel region 16 by the stacked gate structure 20.

Generally speaking, a flash memory device is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating gate, the negative potential of the floating gate raises the threshold voltage ($V_{th}$) of its field effect transistor (FET) and inhibits current flow through the channel region through a subsequent "read" mode. The magnitude of the read current is used to determine whether or not a flash memory device is programmed. The act of discharging the floating gate of a flash memory device is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and a 0V to the control gate and the substrate while floating the drain of the respective memory cell.

Referring again to FIG. 1, conventional source erase operations for the flash memory device 10 operate in the following manner. The memory cell 10 is programmed by applying a relatively high voltage $V_G$ (e.g., approximately 12 volts) to the control gate 28 and a moderately high voltage $V_D$ (e.g., approximately 9 volts) to the drain region 14 in order to produce "hot" electrons in the channel region 16 near the drain region 14. The hot electrons accelerate across the tunnel oxide 22 and into the floating gate 24 and become trapped in the floating gate 24 since the floating gate 24 is surrounded by insulators (the interpoly dielectric 26 and the tunnel oxide 22). As a result of the trapped electrons, the threshold voltage of the memory cell 10 increases by about 3 to 5 volts. This change in the threshold voltage (and thereby the channel conductance) of the memory cell 10 created by the trapped electrons causes the cell to be programmed.

To read the flash memory device 10, a predetermined voltage $V_G$ that is greater than the threshold voltage of an unprogrammed cell, but less than the threshold voltage of a programmed cell, is applied to the control gate 28. If the memory cell 10 conducts, then the memory cell 10 has not been programmed (the cell 10 is therefore at a first logic state, e.g., a zero "0"). Likewise, if the memory cell 10 does not conduct, then the memory cell 10 has been programmed (the cell 10 is therefore at a second logic state, e.g., a one "1"). Consequently, it is possible to read each cell 10 to determine whether or not it has been programmed (and therefore identify its logic state).

In order to erase the flash memory device 10, a relatively high voltage $V_S$ (e.g., approximately 12 volts) is applied to the source region 12 and the control gate 28 is held at a ground potential ($V_G$=0), while the drain region 14 is allowed to float. Under these conditions, a strong electric field is developed across the tunnel oxide 22 between the floating gate 24 and the source region 12. The electrons that are trapped in the floating gate 24 flow toward and cluster at the portion of the floating gate 24 overlying the source region 12 and are extracted from the floating gate 24 and into the source region 12 by way of Fowler-Nordheim tunneling through the tunnel oxide 22. Consequently, as the electrons are removed from the floating gate 24, the memory cell 10 is erased.

The ONO interpoly dielectric layer has a number of important functions including insulating the control gate from the floating gate. Accordingly, it is desirable to form a high quality ONO interpoly dielectric layer. When forming an ONO interpoly dielectric layer, there are a number of concerns. For example, if the top oxide layer is too thick, the required programming voltage increases undesirably. On the other hand, if the top oxide layer is too thin (for example, less than 10 Å), charge retention time decreases undesirably since the charge tends to leak. Moreover, if the nitride layer is too thin, charge leakage from the floating gate to the control gate may be caused, further decreasing charge retention time. Precisely controlling the properties of the ONO interpoly dielectric layer such as thickness of the layers is important, therefore, in controlling the quality and the reliability of the resulting memory device.

It may also be desirable to utilize high-k (high dielectric constant) dielectric materials in ONO interpoly dielectric layers of memory devices. Since 1994, the International Technology Roadmap for Semiconductors (ITRS) has recommended a steady reduction in silicon device size, with an accompanying improvement in device performance, measured predominantly by circuit speed. The ITRS has served as a sort of "how-to" guide for the preservation of Moore's Law, the time-honored pronouncement of these ever-increasing component densities. While a variety of new materials and processes have been added to silicon process technology to maintain this rate of device scaling, a primary limitation has been in the area of photolithography and the ability to pattern and etch the ever-smaller device features. Recently, however, it has become clear that this steady scaling of feature sizes may be limited by the thickness of oxide films made of silicon dioxide ($SiO_2$). This impending barrier has led to the development of new dielectrics as potential replacements for $SiO_2$, known collectively as high-k dielectrics that do not limit the thickness of oxide films. Examples of possible high-k gate oxide materials include silicon nitride ($Si_3N_4$), silicon oxynitrides ($Si_xN_yO_z$), aluminum oxide ($Al_2O_3$), lanthanum oxide ($La_2O_3$), tantalum pentoxide ($Ta_2O_5$), hafnium oxide ($HfO_2$), yttrium oxide ($Y_2O_3$), zirconium oxide ($ZrO_2$), strontium titanate ($SrTiO_3$) and barium strontium titanate ($BaSrTiO_3$), barium titanate ($BaTiO_3$), titanium dioxide ($TiO_2$), cerium oxide ($CeO_2$), lead titanate (PbTiO3), lead zirconate ($PbZrO_3$), tungsten oxide ($WO_3$), barium strontium titanate (BST) ($Ba_{1-x}Sr_xTiO_3$), PMN ($PbMg_xNb_{1-x}O_3$), PZT($PbZr_xTi_{1-x}O_3$), PZN ($PbZn_xNb_{1-x}O_3$), and PST ($PbSc_xTa_{1-x}O_3$), and silicates and aluminates of these oxides.

In any event, the formation of the high-k oxide films in ONO interpoly dielectric layers of memory devices is also important to the quality and the reliability of the finished memory device. In particular, it is important to obtain high-k oxide films that have a uniform thickness and a controlled microstructure so that resulting ONO interpoly dielectric layers exhibit less charge leakage and increased reliability.

What is desired are improved methods of forming ONO interpoly dielectric layers of memory devices. What is also desired are improved methods of forming ONO interpoly dielectric layers using high-k materials. Preferably, the resulting memory devices will exhibit less charge leakage and increased reliability.

SUMMARY OF THE INVENTION

These and other needs are met by embodiments of the present invention which provide an improved method of manufacturing an ONO (oxide-nitride-oxide) insulating layer for a flash memory device. The insulating layer includes a first oxide layer, a nitride layer over the first oxide layer, and a second oxide layer over the nitride layer, and the improved method includes conditioning at least one of the first oxide layer, the nitride layer and the second oxide layer using laser thermal annealing.

Among other features and advantages, the method of the present invention provides ONO insulating layers that exhibit less charge leakage and increased reliability.

In one embodiment, the present invention relates to a method of forming a flash memory device including forming a tunnel oxide on a substrate, forming a first polysilicon layer over the tunnel oxide, and forming an insulating layer over the first polysilicon layer. The insulating layer includes a first oxide layer over the first polysilicon layer, a nitride layer over the first oxide layer, and a second oxide layer over the nitride layer, wherein at least one of the layers of the insulating layer is conditioned using laser thermal annealing. The method also includes forming a second polysilicon layer over the insulating layer, etching at least the first polysilicon layer, the second polysilicon layer and the insulating layer to define at least one stacked gate structure, and forming a source region and a drain region in the substrate. The source region and the drain region are self-aligned by the stacked gate structure, thereby forming at least one memory cell.

In another embodiment, the present invention relates to a method of forming a flash memory device including forming an insulating layer on a substrate. The insulating layer includes a first oxide layer, a nitride layer over the first oxide layer, and a second oxide layer over the nitride layer, wherein at least one of the layers of the insulating layer is conditioned using laser thermal annealing. The method also includes forming a polysilicon layer over the insulating layer, etching at least the polysilicon layer and the insulating layer to define at least one stacked gate structure, and forming a source region and a drain region in the substrate. The source region and the drain region are self-aligned by the stacked gate structure, thereby forming at least one memory cell. The method also includes forming a first-bit line oxide region over the source region of the substrate and forming a second-bit line oxide region over the drain region of the substrate.

In yet another embodiment, the insulating layer of the memory device includes high-K dielectric material.

Additional features and advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

Figure 14:
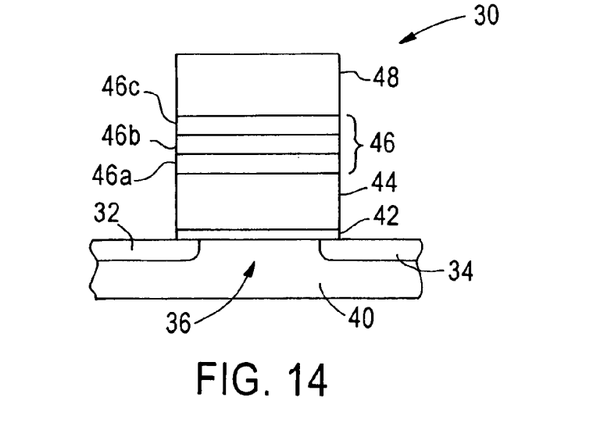
FIG. 14 is a cross-sectional view of relevant portions of a flash memory device produced by the method illustrated in FIGS. 2 through 13.

Referring first to FIG. 14, the present invention generally provides an improved method of manufacturing an ONO (oxide-nitride-oxide) insulating layer 46 for a flash memory device 30. The insulating layer 46 includes a first oxide layer 46a, a nitride layer 46b over the first oxide layer, and a second oxide layer 46c over the nitride layer. The improved method includes conditioning at least one of the first oxide layer 46a, the nitride layer 46b and the second oxide layer 46c using laser thermal annealing.

Among other features and advantages, the method of the present invention provides ONO insulating layers that exhibit less charge leakage and increased reliability. The method of the present invention also facilitates the use of high-k (high dielectric constant) materials in ONO insulating layers. The improved method of the present invention uses laser thermal annealing to provide oxide and nitride layers having uniform thickness and controlled microstructures. The method of the present invention also produces oxide and nitride layers that are relatively free of stress, voids, and excess carbon and organic surface material.

Referring to FIGS. 2 through 14, the fabrication of a single flash memory device 30 in accordance with one exemplary embodiment of the present invention is described. A plurality of the flash memory devices 30 can be formed on a semiconductor substrate 40, such as a silicon die, each with an N-type source region 32 and N-type drain region 34 formed within a P portion of the substrate 40 and a P-type channel region 36 interposed between the source and drain regions 32, 34 in accordance with the present invention. Although fabrication of one flash memory device 30 is described below, it will be understood by those skilled in the art that the methods described herein are applicable to mass production methods wherein two or more devices 30 are formed.

Figure 2:
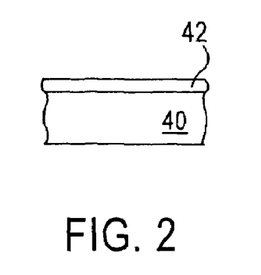
FIGS. 2 through 13 are cross-sectional views illustrating a flash memory device fabrication method according to one embodiment of the present invention.
Figure 4:
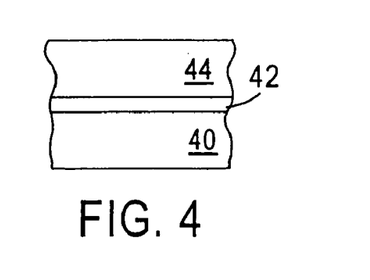

Specifically referring to FIG. 2, in an exemplary embodiment of the invention the method first includes forming a tunnel oxide layer 42 over a P-type substrate 40 in a conventional manner. The tunnel oxide layer 42 is conventionally made of silicon dioxide, a standard dielectric constant (standard-K) dielectric material. But in the present invention, the silicon dioxide may be fully or partially replaced with a mid-K or a high-K dielectric material, as discussed in greater detail below. Referring to FIG. 4, the method also includes depositing a phosphorus doped first polysilicon layer 44 on the tunnel oxide layer 42.

Then a multi-layer interpoly dielectric layer 46 is formed over the surface of the polysilicon layer 44, as illustrated in FIGS. 6 through 11. The dielectric layer 46 is often called the interpoly dielectric since (as will be seen shortly) it is sandwiched between the phosphorus doped polysilicon layer 44 (first polysilicon layer constituting the floating gate for a flash memory device) and a second polysilicon layer 48 (shown in FIG. 12) which forms the control gate for the memory device 30 (shown in FIG. 14). The interpoly dielectric layer 46 is preferably a three layer region of oxide/nitride/oxide (a so called "ONO" layer) and typically has a total thickness of about 100 Å to about 300 Å. Generally speaking, the ONO layer 46 is formed by repetitive depositions of oxide, nitride and oxide to form a dielectric layer in which the nitride is sandwiched between a bottom oxide layer and top oxide layer.

Figure 6:
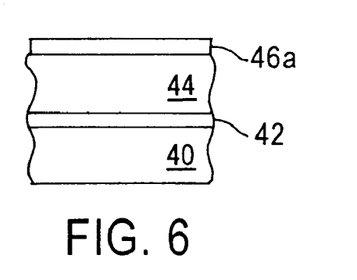

Specifically referring to FIG. 6, the first or bottom oxide layer 46a is deposited, and is provided with a suitable thickness, for example, from about 30 Å to about 100 Å. The nitride layer 46b is next deposited and is provided with a suitable thickness, for example, from about 30 Å to about 150 Å. Then, the second or top oxide layer 46c is formed over the nitride layer 46b, and is provided with a suitable thickness from about 30 Å to about 150 Å.

The interpoly dielectric layer 46 of the present invention can be comprised of a standard-K, a mid-K or a high-K dielectric material or combination thereof. As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, silicon nitride, which has a K of about 6–9, and aluminum oxide, which has a K of about 10.

As used herein, the term "mid-K dielectric material" refers to a dielectric material having a K in the range from greater than 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric material" refers to a dielectric material having a K of about 20 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more.

As used herein, the term "composite dielectric material" refers to a dielectric material comprising the elements of at least two other dielectric materials. A composite dielectric material may have a K value of a standard-K, mid-K or high-K dielectric material, depending on the elements combined to form the composite dielectric material. As described in more detail below, a composite dielectric material may be formed by co-deposition of its component elements, or by sequential deposition followed by a treatment step, e.g., thermal treatment, to combine the elements to form the composite dielectric material.

Using a high-K dielectric material allows for the use of a thicker ONO layer 46. For example, a high-K dielectric material layer with a K of 40 and a thickness of 100 Å is substantially electrically equivalent to a silicon dioxide layer (K about 4) having a thickness of about 10 Å. The electrically equivalent thickness of high-K materials may be referred to in terms of the equivalent oxide thickness. Thus, the thicker high-K material has an equivalent oxide thickness of a thinner silicon dioxide material. By using the high-K material, the reliability problems associated with very thin dielectric layers may be avoided while transistor performance is increased.

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material. In addition, as used herein, when a material is referred to by a specific chemical name or formula, the material may include non-stoichiometric variations of the stoichiometrically exact formula identified by the chemical name. Thus, in the present disclosure, exact stoichiometry is intended only when such is explicitly so stated. As will be understood by those of skill in the art, such variations may occur naturally, or may be sought and controlled by selection and control of the conditions under which materials are formed.

The layers 46a, 46b, 46c are formed by deposition processes including, but not limited to: chemical vapor deposition (CVD), plasma-assisted CVD, metal organic CVD, atomic layer CVD, sputtering and other like deposition processes. For example, if a mid-K or a high-K dielectric material is used, the material is deposited by any appropriate CVD method known in the art for deposition of a high-K material, such as an atomic layer CVD process, a metal organic CVD process, or a rapid thermal CVD process. The mid-K or high-K dielectric material may be formed by reacting a suitable metal containing gas, e.g., hafnium tetra-t-butoxide with a suitable oxygen-containing gas, e.g., oxygen ($O_2$) or nitrous oxide ($N_2O$) in, e.g., a CVD apparatus. In an embodiment in which the CVD is a rapid thermal CVD, the rapid thermal CVD mid-K or high-K dielectric material deposition may be carried out in multiple steps including an initial temperature ramp, a deposition step, and cool-down step.

Atomic layer CVD may be used to deposit a dielectric material in layers as thin as a molecular monolayer, which may also be referred to as a nanolayer. Formation of such nanolayers allows formation of a nano-laminate structure of any selected dielectric materials. The nano-laminate structure provides for deposition of a plurality of different high-K dielectric materials as sub-layers or nanolayers. The sub-layers may be deposited with single dielectric materials or with a plurality of simultaneously formed dielectric materials. The nano-laminates may thus form a composite high-K dielectric material layer.

Figure 7:
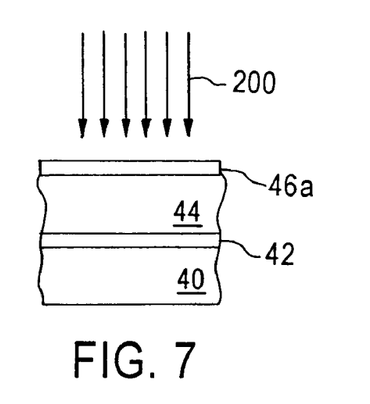
Figure 8:
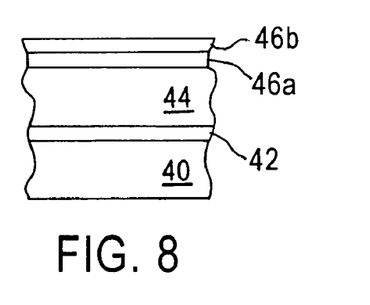
Figure 9:
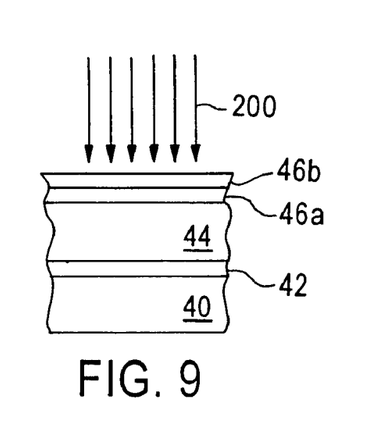
Figure 10:
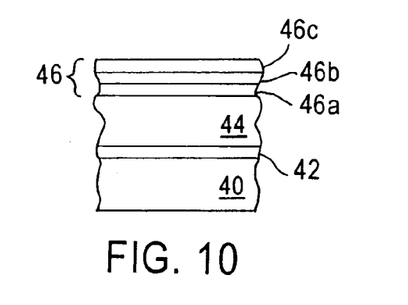
Figure 11:
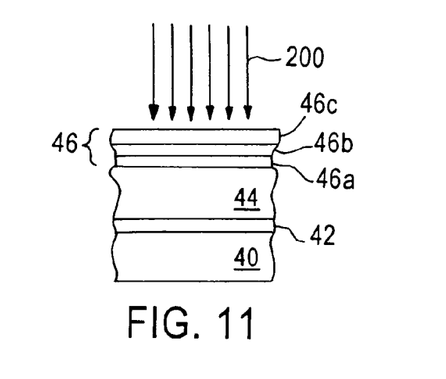
Figure 12:
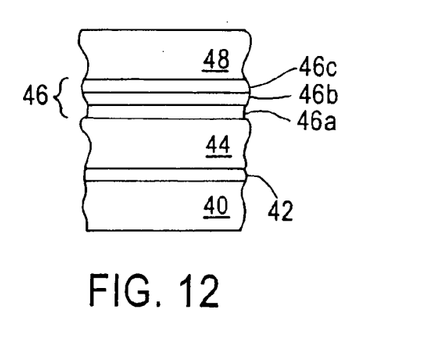

Referring to FIGS. 7, 9 and 11, a method carried out in accordance with an exemplary embodiment of the present invention additionally includes conditioning at least one of the layers 46a, 46b, 46c of the ONO layer 46 using a laser thermal annealing process. The energy from the laser, represented by arrow 200 in FIGS. 7, 9 and 11, is applied to at least one of the layers 46a, 46b, 46c of the ONO layer 46 after the layer has been deposited. An example of a laser capable of providing this energy is a spatially homogenized 308 nm XeCl pulsed laser, although the invention is not limited in this manner, and the energy and power of the laser can vary in accordance with different applications. If the layer is deposited in successive layers, the laser thermal annealing can be conducted on each layer.

The energy from the laser is applied to the deposited layers 46a, 46b, 46c of the ONO layer 46 such that the layer melts. Then the layer(s) of the ONO layer 46 is allowed to rapidly cool, within about one microsecond, and reform epitaxially. In so doing, damage caused by the deposition process, such as surface voids and excess organics and carbon, is removed. The energy fluence of the laser at the surface of the layer(s) determines the melt duration that occurs at the surface, and melt duration is related to maximum melt depth. The relationship between melt duration and maximum melt depth depends on the temporal profile of the laser beam. Precise control of melt depth is possible due to the capability of measuring the full width height maximum (FWHM) of the laser and the surface melt duration during the process. Relatively large changes in the energy fluence are required to create small changes in the maximum melt depth. The total melt time can be varied by varying the number and/or energy of the laser pulses.

The fluence range for laser irradiation can extend from about 50 $mJ/cm^2$ to about 1.3 $J/Cm^2$. However, the fluence of the laser can be advantageously controlled to melt only to a depth that the layer(s) of the ONO layer 46 has been amorphitized because amorphous oxide or nitride absorbs energy at a higher rate than crystalline oxide or nitride. For example, a fluence of about 400 $mJ/cm^2$ can be used to melt amorphous oxide and not melt crystalline oxide, if any.

By melting and rapidly cooling the deposited layer(s) of the ONO layer 46 using laser thermal annealing, the crystallinity and microstructure of the layer(s) can be controlled, such that the layer(s) has uniformly small grain sizes. Surface voids can be removed from the layer(s) and stresses in the layer(s) can be reduced. The laser thermal annealing can be carried out in multiple steps, such as melting the layer(s) at low power and then nucleating and growing the grains of the layer(s) such that the grains have an average size between about 10 and 100 angstroms.

Annealing by laser is a well-understood process that correlates strongly to conventional oven annealing. However, lasers offer some advantages over conventional heating sources. For example, the induction or flow of heat energy into the desired substrate is more rapid. Turning off the laser instantly turns off the heating source. Lasers allow much more efficient control of the size of the area to be heated, whether large or localized. The variety of lasers available (in terms of wavelength, power, and pulse width) allows flexibility in dealing with diverse substrates and materials. Laser heating can also produce temperature ramping where desired. All of these processes can easily be controlled by computer for purposes of automation and precise control of heating rates.

In the exemplary embodiment of FIGS. 6 through 11 each layer 46a, 46b, 46c of the ONO layer 46 is conditioned using laser thermal annealing. Alternatively, however, only one or two of the layers 46a, 46b, 46c can be conditioned using laser thermal annealing, and/or the entire ONO layer 46 can conditioned using laser thermal annealing after the second oxide layer 46c is deposited.

Figure 3:
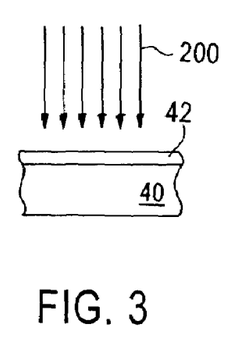
Figure 5:
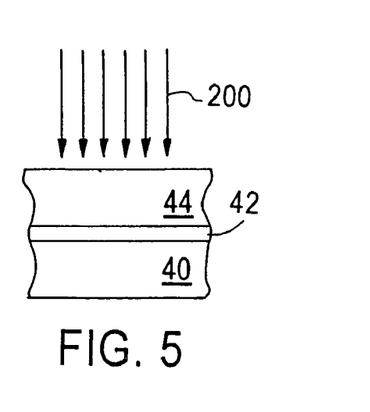
Figure 13:
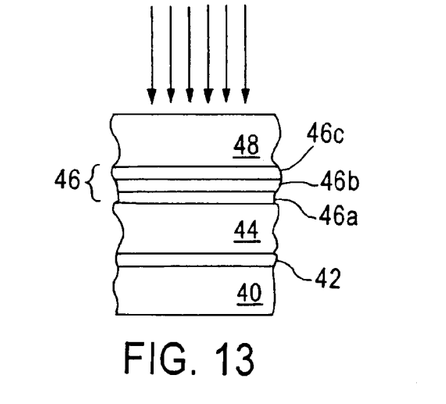

Referring to FIG. 3, a method carried out in accordance with an exemplary embodiment of the present invention can also include conditioning the tunnel oxide layer 42 using a laser thermal annealing process, in the manner described above with respect to the ONO layer 46. As shown in FIGS. 5 and 13, respectively, a method carried out in accordance with an exemplary embodiment of the present invention can also include conditioning the first polysilicon layer 44 and/or the second polysilicon layer 48 using a laser thermal annealing process, in the manner described above with respect to the ONO layer 46.

Figure 15:
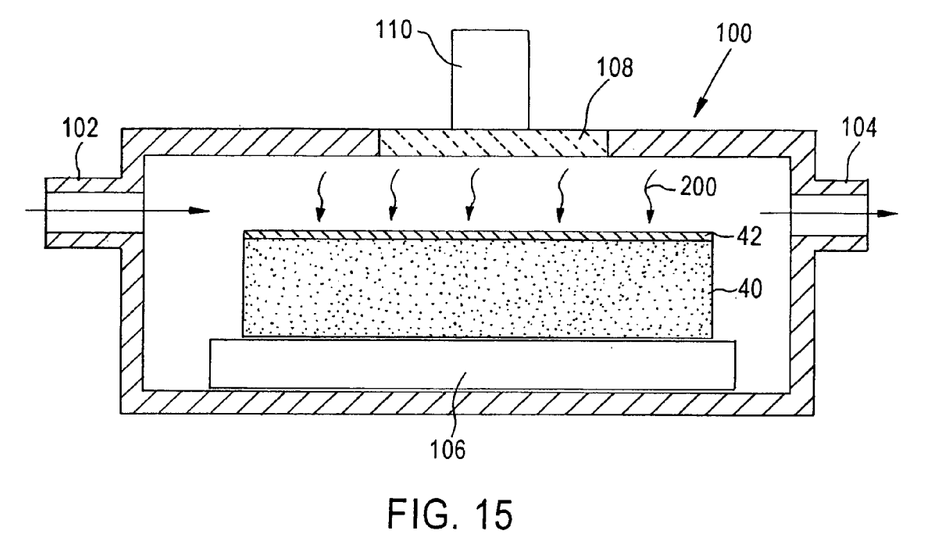
FIG. 15 schematically illustrates a portion of a flash memory device positioned in a process chamber adapted to carry out laser thermal annealing in conjunction with chemical vapor deposition according to an embodiment of the present invention.

As illustrated in FIG. 15, the deposition and laser thermal annealing methods of the present invention can be carried out in a single process chamber 100 for each layer. In this manner, the laser thermal annealing is conducted "in-situ"

during the deposition process of a layer. As shown, the process chamber 100 generally includes an inlet port 102 and an outlet port 104. A heater 106 is positioned within the chamber 100 for supporting and heating the portion of the semiconductor device 30 during the combined deposition and laser thermal annealing method. The deposition is carried out by introducing gaseous reactants into the chamber 100 through the inlet port 102, while heating the semiconductor device 10 with the heater 106 such that a portion of the reactants react and become deposited as layer 42 on the substrate 40 of the device 30. Gaseous byproducts are then removed from the chamber 100 through the outlet port 104.

The chamber 100 also includes a laser-transparent window 108. A laser 110 for conducting the laser thermal annealing is positioned so as to direct laser energy through the window 108 and against the deposited layer 42 of the semiconductor device 30 contained within the chamber 100, as illustrated by arrows 200. Although not shown, the chamber 100 and the laser 110 can further include such components as a power source, fluid control devices, and a control system including a computer and user-interface devices.

Referring to FIG. 14, the remaining steps of forming the memory device 30 are generally well known in the art and may be varied. For example, suitable lithography and etching procedures can be used to remove various portions of the device 30 after the second polysilicon layer 48 has been formed, such as the gate mask and gate etch and then the self aligned mask and self aligned etch.

The fabrication of the flash memory device 30 is then completed by forming the source and drain regions 32, 34 by, for example, ion implantation. Annealing completes the formation of the source and drain regions 32, 34. During programming, the source region 32 and the substrate 40 of the memory device 30 may be tied to a ground, the drain region 34 coupled to a relatively high voltage (for example, between about +5 V to about +9 V), and the control gate 48 connected to a relatively high voltage level (for example, above about +10 V). Electrons are accelerated from the source region 32 to the drain region 34 and so-called "hot-electrons" are generated near the drain region 34. Some of the hot electrons are injected through the relatively thin tunnel oxide layer 42 and become trapped in the floating gate 44 thereby providing the floating gate 44 with a negative potential. During erasure, a high positive voltage (such as above about +12 V) is applied to the source region 32, a ground potential ($V_g$ equals 0 V) is applied to the control gate 48, and a similar ground potential ($V_{sub}$ equals 0 V) is applied to the substrate 40.

The voltage $V_D$ of the drain region 34 is permitted to float. In this mode, electrons previously stored during programming in the floating gate 44 pass through tunnel oxide layer 42 by way of Fowler-Nordheim tunneling and travel into the source region 32 as a result of the electric field established between the control gate 48 and the source region 32 ($V_{GS}$ equals about 12 V). Since the top oxide layer 46c is characterized by reduced charge trapping, Fowler-Nordheim tunneling and travel of electrons from the floating gate 44 to the source region 32 is facilitated.

In another possible embodiment, the memory device 30 of FIG. 14 can further be provided with a tungsten silicide layer deposited on the control gate 48, a poly-cap layer deposited over the tungsten silicide layer, and a capping layer deposited over the poly-cap layer.

Figure 16:
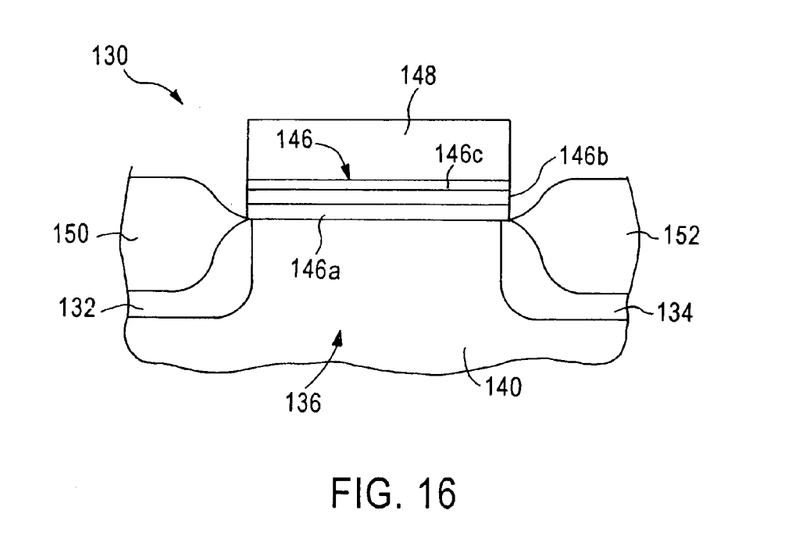
FIG. 16 is a cross-sectional view of relevant portions of another exemplary embodiment of a flash memory device produced by the method of the present invention.

Referring to FIG. 16, a further exemplary embodiment of a flash memory device constructed in accordance with a method of the present invention is shown. The flash memory device of FIG. 16 is similar to the flash memory device of FIG. 14, such that similar elements have the same reference numeral preceded by a "1". The flash memory device of FIG. 16 includes an ONO layer 146 constructed using a method of the present invention as described above (i.e., including conditioning the ONO layer 146 using laser thermal annealing). The first or bottom oxide layer 146a is provided with a suitable thickness, for example, from about 50 Å to about 100 Å. The nitride layer 146b is provided with a suitable thickness, for example, from about 50 Å to about 150 Å. The second or top oxide layer 146c is provided with a suitable thickness from about 50 Å to about 200 Å.

The flash memory device of FIG. 16 does not include a first polysilicon layer and a tunnel oxide layer between the substrate 140 and the ONO layer 146 (e.g., see the first polysilicon layer 44 and the tunnel oxide layer 42 of FIG. 14), such that the first oxide layer 146a acts as a tunnel oxide layer. The flash memory device of FIG. 16 further includes first- and second-bit line oxide regions 150, 152 formed respectively over the source region 132 and the drain region 134. This kind of ONO structure is used in FLASH memory devices based on MONOS (metal-oxide-nitride-oxide-semiconductor) devices, such as the MirrorBit™ (FLASH memory device available from the assignee of the present invention Advanced Micro Devices, Inc.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a flash memory device of a semiconductor device, comprising:
   growing or depositing a tunnel oxide on a substrate;
   depositing a first polysilicon layer over the tunnel oxide;
   forming an insulating layer over the first polysilicon layer, the insulating layer comprising a first oxide layer, a nitride layer over the first oxide layer, and a second oxide layer over the nitride layer, wherein at least one of the first oxide layer, the nitride layer and the second oxide layer are conditioned using laser thermal annealing;
   depositing a polysilicon layer over the insulating layer;
   etching at least the polysilicon layer and the insulating layer; and
   forming a source region and a drain region in the substrate.

2. The method of manufacturing a flash memory device according to claim 1, wherein the first oxide layer is conditioned using laser thermal annealing.

3. The method of manufacturing a flash memory device according to claim 1, wherein the second oxide layer is conditioned using laser thermal annealing.

4. The method of manufacturing a flash memory device according to claim 1, wherein the nitride layer is conditioned using laser thermal annealing.

5. The method of manufacturing a flash memory device according to claim 1, wherein the oxide layers are conditioned using laser thermal annealing.

6. The method of manufacturing a flash memory device according to claim 1, wherein each of the nitride layer and the oxide layers are conditioned using laser thermal annealing.

7. The method of manufacturing a flash memory device according to claim 1, wherein the first and the second oxide layers are deposited using chemical vapor deposition.

8. The method of manufacturing a flash memory device according to claim 1, wherein the second oxide layer is conditioned using laser thermal annealing and the laser thermal annealing includes melting the second oxide layer at a relatively low power and allowing the melted layer to cool relatively rapidly.

9. The method of manufacturing a flash memory device according to claim 1, wherein the insulating layer is laser thermal annealed such that the layer has a substantially uniform grain size.

10. The method of manufacturing a flash memory device according to claim 1, wherein the laser thermal annealing melts amorphized regions of the insulating layer and does not melt recrystallized regions of the insulating layer.

11. The method of manufacturing a flash memory device according to claim 1, wherein the insulating layer comprises a standard-K dielectric material.

12. The method of manufacturing a flash memory device according to claim 1, wherein the insulating layer comprises a mid-K dielectric material.

13. The method of manufacturing a flash memory device according to claim 1, wherein the insulating layer comprises a high-K dielectric material.

14. The method of manufacturing a flash memory device according to claim 1, wherein the insulating layer comprises at least one of silicon nitride ($Si_3N_4$), silicon oxynitrides ($Si_xN_yO_z$), aluminum oxide ($Al_2O_3$), lanthanum oxide ($La_2O_3$), tantalum pentoxide ($Ta_2O_5$), hafnium oxide ($HfO_2$), yttrium oxide ($Y_2O_3$), zirconium oxide ($ZrO_2$), strontium titanate ($SrTiO_3$) and barium strontium titanate ($BaSrTiO_3$), barium titanate ($BaTiO_3$), titanium dioxide ($TiO_2$), cerium oxide ($CeO_2$), lead titanate ($PbTiO_3$), lead zirconate ($PbZrO_3$), tungsten oxide ($WO_3$), barium strontium titanate (BST) ($Ba_{1-x}Sr_xTiO_3$), PMN ($PbMg_xNb_{1-x}O_3$), PZT($PbZr_xTi_{1-x}O_3$), PZN ($PbZn_xNb_{l-x}O_3$), and PST ($PbSc_xTa_{l-x}O_3$), and silicates and aluminates of these oxides.

15. The method of manufacturing a flash memory device according to claim 1, wherein the insulating layer comprises at least one of silicon dioxide, silicon nitride, silicon oxynitride and aluminum oxide.

16. The method of manufacturing a flash memory device according to claim 1, wherein the at least one layer that is conditioned using laser thermal annealing is first deposited using chemical vapor deposition, and the deposition and the laser thermal annealing are conducted in the same process chamber.

17. The method of manufacturing a flash memory device according to claim 1, wherein the first oxide layer a thickness from about 30 Å to about 15 Å.

18. The method of manufacturing a flash memory device according to claim 1, wherein the second oxide layer a thickness from about 30 Å to about 150 Å.

19. The method of manufacturing a flash memory device according to claim 1, wherein the nitride layer a thickness from about 50 Å to about 150 Å.

20. The method of manufacturing a flash memory device according to claim 1, wherein the tunnel oxide and the first polysilicon layer are conditioned using laser thermal annealing.

21. The method of manufacturing a flash memory device according to claim 1, further comprising forming a first-bit line oxide region over the source region of the substrate and forming a second-bit line oxide region over the drain region of the substrate.

22. The method of manufacturing a flash memory device according to claim 20, wherein the first oxide layer a thickness from about 50 Å to about 150 Å.

23. The method of manufacturing a flash memory device according to claim 20, wherein the second oxide layer a thickness from about 100 Å to about 200 Å.

24. The method of manufacturing a flash memory device according to claim 20, wherein the nitride layer a thickness from about 50 Å to about 150 Å.

25. The method of manufacturing a flash memory device according to claim 1, wherein the polysilicon layer is conditioned using laser thermal annealing.

26. A method of manufacturing a flash memory device of a semiconductor device, comprising:
forming an insulating layer over a substrate, the insulating layer comprising a first oxide layer, a nitride layer over the first oxide layer, and a second oxide layer over the nitride layer, wherein at least one of the first oxide layer, the nitride layer and the second oxide layer are conditioned using laser thermal annealing;
depositing a polysilicon layer over the insulating layer;
etching at least the polysilicon layer and the insulating layer;
forming a source region and a drain region in the substrate; and
wherein the insulating layer is laser thermal annealed such that the layer has a substantially uniform grain size.

27. A method of manufacturing a flash memory device of a semiconductor device, comprising:
forming an insulating layer over a substrate, the insulating layer comprising a first oxide layer, a nitride layer over the first oxide layer, and a second oxide layer over the nitride layer, wherein at least one of the first oxide layer, the nitride layer and the second oxide layer are conditioned using laser thermal annealing;
depositing a polysilicon layer over the insulating layer;
etching at least the polysilicon layer and the insulating layer;
forming a source region and a drain region in the substrate; and
wherein the at least one layer that is conditioned using laser thermal annealing is first deposited using chemical vapor deposition, and the deposition and the laser thermal annealing are conducted in the same process chamber.

* * * * *

UNITED STATES PATENT AND TRADEMARK OFFICE
CERTIFICATE OF CORRECTION

PATENT NO. : 7,001,814 B1 Page 1 of 1
APPLICATION NO. : 10/438942
DATED : February 21, 2006
INVENTOR(S) : Arvind Halliyal et al.

It is certified that error appears in the above-identified patent and that said Letters Patent is hereby corrected as shown below:

Claim 17,
Column 11, line 52, change "15" to --150--

Signed and Sealed this

Twenty-fifth Day of July, 2006

JON W. DUDAS
*Director of the United States Patent and Trademark Office*